(12) United States Patent
Tsao et al.

(10) Patent No.: US 7,659,632 B2
(45) Date of Patent: Feb. 9, 2010

(54) SOLDER BUMP STRUCTURE AND METHOD OF MANUFACTURING SAME

(75) Inventors: Pei-Haw Tsao, Taichung (TW); Bill Kiang, Hsinchu (TW); Pao-Kang Niu, Hsinchu (TW); Liang-Chen Lin, Hsinchu (TW); I-Tai Liu, Taipei (TW)

(73) Assignee: Taiwan Seminconductor Manufacturing Co., Ltd., Hsin-Chu (TW)

( * ) Notice: Subject to any disclaimer, the term of this patent is extended or adjusted under 35 U.S.C. 154(b) by 427 days.

(21) Appl. No.: 11/592,220

(22) Filed: Nov. 3, 2006

(65) Prior Publication Data

US 2008/0122086 A1    May 29, 2008

(51) Int. Cl.
*H01L 23/48* (2006.01)
*H01L 23/52* (2006.01)
*H01L 29/40* (2006.01)

(52) U.S. Cl. .................. 257/778; 257/737; 257/779; 257/738

(58) Field of Classification Search ............... 257/778, 257/737, 772, 779, 738, 780, 781
See application file for complete search history.

(56) References Cited

U.S. PATENT DOCUMENTS

| 6,551,856 B1* | 4/2003 | Lee ........................... 438/108 |
| 2008/0122086 A1* | 5/2008 | Tsao et al. .................. 257/738 |

* cited by examiner

*Primary Examiner*—Chuong A. Luu
(74) *Attorney, Agent, or Firm*—Birch, Stewart, Kolasch & Birch, LLP

(57) ABSTRACT

Solder bump structures for semiconductor device packaging is provided. In one embodiment, a semiconductor device comprises a substrate having a bond pad and a first passivation layer formed thereabove, the first passivation layer having an opening therein exposing a portion of the bond pad. A metal pad layer is formed on a portion of the bond pad, wherein the metal pad layer contacts the bond pad. A second passivation layer is formed above the metal pad layer, the second passivation layer having an opening therein exposing a portion of the metal pad layer. A patterned and etched polyimide layer is formed on a portion of the metal pad layer and a portion of the second passivation layer. A conductive layer is formed above a portion of the etched polyimide layer and a portion of the metal pad layer, wherein the conductive layer contacts the metal pad layer. A conductive bump structure is connected to the conductive layer.

20 Claims, 2 Drawing Sheets

US 7,659,632 B2

SOLDER BUMP STRUCTURE AND METHOD OF MANUFACTURING SAME

BACKGROUND

The present invention relates generally to the fabrication of semiconductor devices, and more particularly, to solder bump structures in the packaging of semiconductor devices.

The packaging of integrated circuit (IC) chips is one of the most important steps in the manufacturing process, contributing significantly to the overall performance, reliability, and cost of the packaged chip. As semiconductor devices reach higher levels of integration, packaging technologies, such as chip bonding, have become critical. With the continued reduction in device sizes, the density of devices on a chip increases, along with the size of the chip, thereby making chip bonding more challenging. One of the major problems leading to package failure as chip sizes increase is the increasingly difficult problem of coefficient of thermal expansion (CTE) mismatches between materials leading to stress buildup and consequent failure. More specifically, in flip-chip packaging, a series of solder bumps are formed upon a semiconductor substrate in order to facilitate physical and electrical connection of the die to a separate substrate. FIG. 1 is a cross-sectional view of a conventional solder bump structure, which contains the following sub-components:

10 is a semiconductor substrate over which the solder bump is to be formed.

12 is the contact pad, typically containing copper or aluminum, which is to be brought into contact with the solder bump to be formed.

14 is a patterned first passivation layer.

16 is a metal pad layer, typically containing aluminum, which may be input/output routing traces.

18 is a patterned second passivation layer.

20 is a patterned layer of insulation that contains polyimide.

22 is a layer of Under Bump Metallurgy (UBM), and

24 is the formed solder bump.

In advanced IC packaging, the formation of solder bump structures onto the die requires the use of polyimide for planarization in order to facilitate proper attachment of the solder bumps to a separate die. The polyimide layer needs to be applied on the passivation layer in order to planarize the IC surface to resolve the UBM step-coverage problem. More specifically, a layer of polyimide produces a surface in which the step height of underlying features, such as input/output routing traces is reduced, and step slopes are gentle and smooth. It is common in the industry for a polyimide layer to be deposited across the entire semiconductor die following the formation of a passivation layer. However, with the polyimide layer applied globally on the die, chip warpage becomes an issue due to the high coefficient of thermal expansion mismatches between the polyimide layer and the underlying and adjacent structures. A change in the polyimide characteristics may limit the adhesion of the polyimide layer to the underlying passivation layers, as well as to the overlying Under Bump Metallurgy layers thereby leading to device performance and reliability problems, which in turn reduces production yield.

For these reasons and other reasons that will become apparent upon reading the following detailed description, there is a need for an improved solder bump structure in advanced IC packaging such as flip chip that avoids the problems associated with conventional solder bump structures.

SUMMARY

The present invention is directed to solder bump structures for semiconductor device packaging. In one embodiment, a semiconductor device comprises a substrate having a bond pad and a first passivation layer formed thereabove, the first passivation layer having an opening therein exposing a portion of the bond pad. A metal pad layer is formed on a portion of the bond pad, wherein the metal pad layer contacts the bond pad. A second passivation layer is formed above the metal pad layer, the second passivation layer having an opening therein exposing a portion of the metal pad layer. A patterned and etched polyimide layer is formed on a portion of the metal pad layer and a portion of the second passivation layer. A conductive layer is formed above a portion of the etched polyimide layer and a portion of the metal pad layer, wherein the conductive layer contacts the metal pad layer. A conductive bump structure is connected to the conductive layer.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details. In some instances, well-known processes and structures have not been described in detail to avoid unnecessarily obscuring the present invention.

Figure 1:
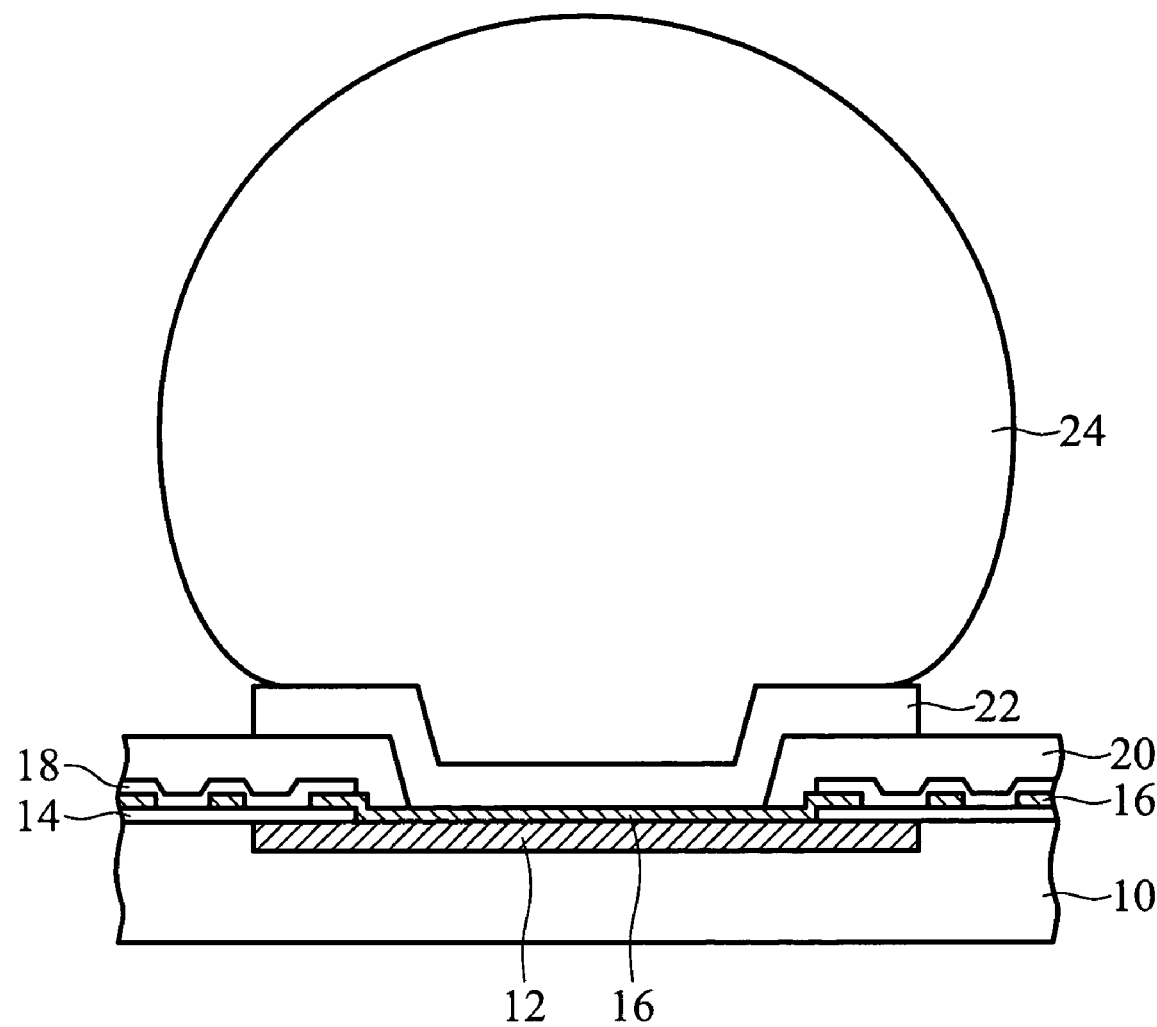
FIG. 1 is a cross-sectional view of a conventional solder bump structure.
Figure 2:
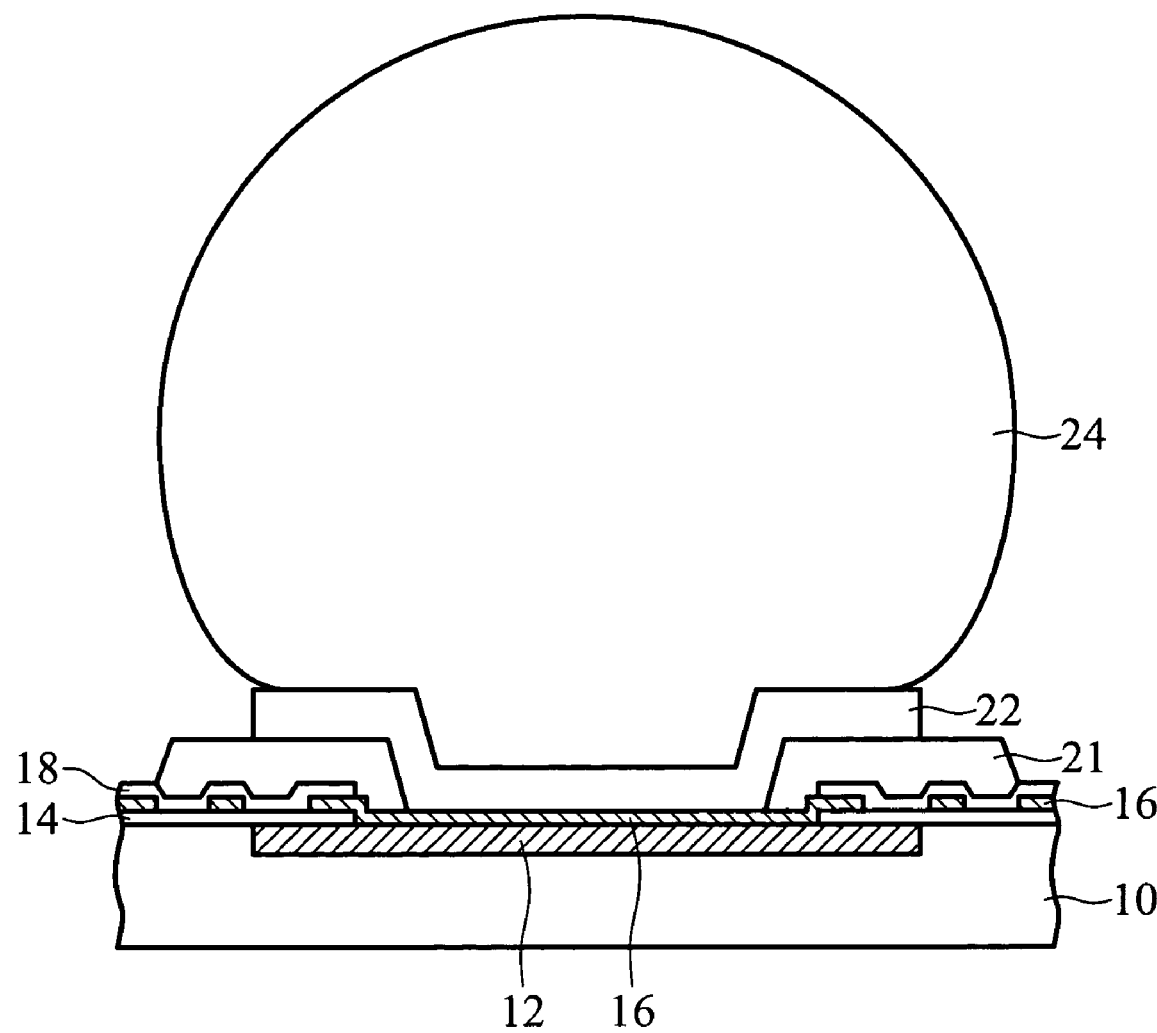
FIG. 2 is a cross-sectional view of a solder bump structure according to one embodiment of the present invention.

FIG. 2 is a cross-sectional view of a solder bump structure according to one embodiment of the present invention. The solder bump structure has a semiconductor substrate 10 having a bond pad 12 and a first passivation layer 14 having an opening therein exposing a portion of bond pad 12. Electrical contact to the chip is typically established by means of bond pads or contact pads that form electrical interfaces with patterned levels of interconnecting metal lines. Bond pad 12 may be formed by conventional vapor deposition (CVD) techniques and may be, for example copper, aluminum, or other conductive metals. After bond pad 12 has been created on the surface of substrate 10, bond pad 12 is passivated and electrically insulated by the deposition of passivation layers over the surface of bond pad 12. First passivation layer 14 is deposited onto bond pad 12 and substrate 10 using conventional CVD techniques and is thereafter patterned and etched to create an opening therein that aligns with bond pad 12. The openings in the first passivation layer 14 over bond pad 12 allow for subsequent electrical contact to a solder bump. The first passivation layer 14 may comprise of silicon nitride (SiN), silicon dioxide ($SiO_2$), and silicon oxynitride (SiON) and in one embodiment has a thickness of from about 1,000 Å to about 20,000 Å. A metal pad layer 16 is next formed on a portion of the bond pad 12, wherein the metal pad layer 16 contacts the bond pad 12. The metal pad layer 16 typically contains input/output routing traces and may comprise of aluminum or other conductive metal.

A second passivation layer 18 is formed above the metal pad layer 16, the second passivation layer 18 having an opening therein exposing a portion of the metal pad layer 16. The second passivation layer 18 may comprise of silicon nitride (SiN), silicon dioxide (SiO$_2$), and silicon oxynitride (SiON) and in one embodiment has a thickness of from about 1,000 Å to about 20,000 Å.

Unlike the industry standard where a single polyimide layer is deposited across the entire semiconductor die following the formation of an upper passivation layer, in one aspect of the present invention, individual and isolated polyimide layers are deposited on the passivation layer, overlaying and aligning with the underlying contact pad. By forming individual and isolated polyimide layers as opposed to a single polyimide layer, the amount of polyimide used in forming bump structures is limited and thus the problems of warpage and delamination of the prior art can be avoided. With reference back to FIG. 2, a layer of polyimide 21 is deposited on a portion of the metal pad layer 16 and a portion of the second passivation layer 18 by conventional deposition techniques such as spin-on coating. Polyimide layer 21 may be subsequently cured after deposition at for instance 400 degrees C. for one hour in a vacuum or nitrogen environment. The polyimide layer 21 is thereafter patterned and etched to form individual and isolated polyimide layers and an opening is created therein that exposes and aligns with the bond pad 12. In one embodiment, the polyimide layer 21 may comprise of polyamide insulator and have a thickness of from about 20,000 Angstrom to about 100,000 Angstrom and in another embodiment the polyimide layer 21 may comprise of BCB (Bisbenzocyclobutene), which is produced by Dow Chemicals.

Typically, a conductive layer 22, comprising of one or more under bump metallurgy (UBM) layers, of from about 500 Å to about 100,000 Å is thereafter deposited above a portion of the individual and isolated polyimide layer 21 and a portion of the metal pad layer 16, wherein the conductive layer 22 contacts the metal pad layer 16. UBM layers may be formed by conventional electroplating or vapor deposition processes. UBM layers are typically formed over the bond pad 12 to allow for better bonding and wetting of the solder material to the uppermost UBM layer adjacent to the solder material, and for protection of the bond pad 12 by the lowermost UBM layer. After formation of a column of solder column (not shown) by conventional photolithographic processes, the solder column is then heated to a melting point ("reflow") to form a conductive bump structure or solder bump 24 over the UBM layer 22.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A semiconductor device comprising:
   a semiconductor substrate having a bond pad and a first passivation layer formed thereabove, the first passivation layer having an opening therein exposing a portion of the bond pad;
   a metal pad layer formed on a portion of the bond pad, wherein the metal pad layer contacts the bond pad;
   a second passivation layer formed above the metal pad layer, the second passivation layer having an opening therein exposing a portion of the metal pad layer;
   a patterned and etched polyimide layer partially covering the metal pad layer and the second passivation layer to expose a portion of the second passivation layer above a portion of the metal pad layer;
   a conductive layer formed above a portion of the etched polyimide layer and a portion of the metal pad layer, wherein the conductive layer contacts the metal pad layer; and
   a conductive bump structure connected to the conductive layer.

2. The semiconductor device of claim 1, wherein the first passivation layer is a material selected from the group consisting of silicon nitride (SiN), silicon dioxide (SiO$_2$) and silicon oxynitride (SiON) and has a thickness of from about 1,000 Å to about 20,000 Å.

3. The semiconductor device of claim 1, wherein the metal pad layer comprises aluminum.

4. The semiconductor device of claim 1, wherein the second passivation layer is a material selected from the group consisting of silicon nitride (SiN), silicon dioxide (SiO$_2$) and silicon oxynitride (SiON) and has a thickness of from about 1,000 Å to about 20,000 Å.

5. The semiconductor device of claim 1, wherein the polyimide layer comprises polyamide insulator and has a thickness of from about 20,000 Angstrom to about 100,000 Angstrom.

6. The semiconductor device of claim 1, wherein the conductive layer comprises an UBM (Under Bump Metallurgy) layer.

7. A bump structure on a semiconductor substrate comprising:
   a semiconductor substrate having a bond pad and a first passivation layer formed thereabove, the first passivation layer having an opening therein exposing a portion of the bond pad;
   a metal pad layer formed on a portion of the bond pad, wherein the metal pad layer contacts the bond pad;
   a second passivation layer formed above the metal pad layer, the second passivation layer having an opening therein exposing a portion of the metal pad layer;
   a patterned and etched polyimide layer partially covering the metal pad layer and the second passivation layer to expose a portion of the second passivation layer above a portion of the metal pad layer;
   a conductive layer formed above a portion of the etched polyimide layer and a portion of the metal pad layer, wherein the conductive layer contacts the metal pad layer; and
   a conductive bump structure connected to the conductive layer.

8. The bump structure of claim 7, wherein the first passivation layer is a material selected from the group consisting of silicon nitride (SiN), silicon dioxide (SiO$_2$) and silicon oxynitride (SiON) and has a thickness of from 1,000 Å to about 20,000 Å.

9. The bump structure of claim 7, wherein the metal pad layer comprises aluminum.

10. The bump structure of claim 7, wherein the second passivation layer is a material selected from the group consisting of silicon nitride (SiN), silicon dioxide (SiO$_2$) and silicon oxynitride (SiON) and has a thickness of from about 1,000 Å to about 20,000 Å.

11. The semiconductor device of claim 7, wherein the polyimide layer comprises polyamide insulator and has a thickness of from about 20,000 Angstrom to about 100,000 Angstrom.

12. The bump structure of claim 7, wherein the conductive layer comprises an UBM (Under Bump Metallurgy) layer.

13. A flip chip package structure comprising:
   a semiconductor substrate having a bond pad and a first passivation layer formed thereabove, the first passivation layer having an opening therein exposing a portion of the bond pad;
   a metal pad layer formed on a portion of the bond pad, wherein the metal pad layer contacts the bond pad;
   a second passivation layer formed above the metal pad layer, the second passivation layer having an opening therein exposing a portion of the metal pad layer;
   a patterned and etched polyimide layer partially covering the metal pad layer and the second passivation layer to expose a portion of the second passivation layer above a portion of the metal pad layer;
   a conductive layer formed above a portion of the etched polyimide layer and a portion of the metal pad layer, wherein the conductive layer contacts the metal pad layer; and
   a conductive bump structure connected to the conductive layer.

14. The package structure of claim 13, wherein the first passivation layer is a material selected from the group consisting of silicon nitride (SiN), silicon dioxide ($SiO_2$) and silicon oxynitride (SiON) and has a thickness of from about 1,000 Å to about 20,000 Å.

15. The package structure of claim 13, wherein the metal pad layer comprises aluminum.

16. The package structure of claim 13, wherein the second passivation layer is a material selected from the group consisting of silicon nitride (SiN), silicon dioxide ($SiO_2$) and silicon oxynitride (SiON) and has a thickness of from about 1,000 Å to about 20,000 Å.

17. The semiconductor device of claim 13, wherein the polyimide layer comprises polyamide insulator and has a thickness of from about 20,000 Angstrom to about 100,000 Angstrom.

18. The package structure of claim 13, wherein the conductive layer comprises an UBM (Under Bump Metallurgy) layer.

19. A method of manufacturing a semiconductor device, comprising:
   providing a semiconductor substrate having a bond pad and a first passivation layer formed thereabove, the first passivation layer having an opening therein exposing a portion of the bond pad;
   forming a metal pad layer on a portion of the bond pad, wherein the metal pad layer contacts the bond pad;
   forming a second passivation layer above the metal pad layer, the second passivation layer having an opening therein exposing a portion of the metal pad layer;
   partially covering the metal pad layer and the overlying second passivation layer by individual and isolated polyimide layers to expose a portion of the second passivation layer and a portion of the metal pad layer thereunder;
   forming a conductive layer above a portion of the individual and isolated polyimide layers and a portion of the metal pad layer, wherein the conductive layer contacts the metal pad layer; and
   forming a conductive bump connected to the conductive layer.

20. A product formed by the method of claim 19.

* * * * *